(12) United States Patent
Wang et al.

(10) Patent No.: US 11,620,932 B2
(45) Date of Patent: Apr. 4, 2023

(54) DISPLAYING DEVICE AND DRIVING METHOD THEREOF

(71) Applicants: Beijing BOE Optoelectronics Technology Co., Ltd., Beijing (CN); BOE Technology Group Co., Ltd., Beijing (CN)

(72) Inventors: Zhiqiang Wang, Beijing (CN); Lin Xu, Beijing (CN); Xin Ma, Beijing (CN); Qiuli Wang, Beijing (CN); Chuan Sun, Beijing (CN); Jianfeng Yao, Beijing (CN); Dingyang Tan, Beijing (CN); Xinyu Wang, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/202,852

(22) Filed: Mar. 16, 2021

(65) Prior Publication Data
US 2022/0068187 A1 Mar. 3, 2022

(30) Foreign Application Priority Data

Aug. 26, 2020 (CN) .......................... 202010873202.2

(51) Int. Cl.
*G09G 3/20* (2006.01)
*G02F 1/1362* (2006.01)
(Continued)

(52) U.S. Cl.
CPC ..... *G09G 3/2074* (2013.01); *G02F 1/136286* (2013.01); *G09G 3/3208* (2013.01);
(Continued)

(58) Field of Classification Search
CPC .. G09G 3/2074; G09G 3/3208; G09G 3/3607; G09G 2300/0452;
(Continued)

(56) References Cited

U.S. PATENT DOCUMENTS

| 11,164,543 B1* | 11/2021 | Gao | ...................... G09G 3/2074 |
| 2009/0066636 A1* | 3/2009 | Kim | ........................ G09G 3/344 345/55 |

(Continued)

FOREIGN PATENT DOCUMENTS

| CN | 107966857 A | 4/2018 |
| CN | 108899355 A | 11/2018 |

OTHER PUBLICATIONS

Office Action dated Jun. 28, 2022 and Search Report dated Jun. 17, 2022, issued in counterpart CN application No. 202010873202.2, with English Machine Translation. (15 pages).

*Primary Examiner* — Douglas M Wilson
(74) *Attorney, Agent, or Firm* — WHDA, LLP

(57) ABSTRACT

A displaying device and a driving method thereof, wherein the displaying device includes a first display panel, a second display panel and a driving circuit; the first display panel includes a plurality of first pixel units that are able to display a color, wherein each of the first pixel units includes a plurality of sub-pixel units; and the second display panel is provided on a light exiting side of the first display panel, including a plurality of second pixel units; wherein a distribution density of the plurality of second pixel units is greater than a distribution density of the plurality of sub-pixel units.

12 Claims, 4 Drawing Sheets

(51) Int. Cl.
*G09G 3/3208* (2016.01)
*G09G 3/36* (2006.01)
*H01L 27/32* (2006.01)
*G09G 3/18* (2006.01)
*G02F 1/1343* (2006.01)
*G05D 25/02* (2006.01)

(52) U.S. Cl.
CPC ....... *G09G 3/3607* (2013.01); *H01L 27/3267* (2013.01); *H01L 27/3276* (2013.01); *G02F 1/134336* (2013.01); *G05D 25/02* (2013.01); *G09G 3/18* (2013.01); *G09G 3/36* (2013.01); *G09G 3/3611* (2013.01); *G09G 2300/023* (2013.01); *G09G 2300/0452* (2013.01); *G09G 2320/066* (2013.01); *G09G 2330/021* (2013.01); *G09G 2330/023* (2013.01); *H01L 27/3244* (2013.01)

(58) Field of Classification Search
CPC .. G09G 2320/066; G09G 3/3648; G09G 3/18; G09G 3/36; G09G 3/3611; G09G 2330/021; G09G 2330/023; G02F 1/136286; G02F 1/1362; G02F 1/134336; H01L 27/3267; H01L 27/3276; H01L 27/3244; H01L 27/3246; G05D 25/02
See application file for complete search history.

(56) References Cited

U.S. PATENT DOCUMENTS

| | | | |
|---|---|---|---|
| 2014/0043369 A1* | 2/2014 | Albrecht | G09G 3/2074 345/690 |
| 2017/0310956 A1* | 10/2017 | Perdices-Gonzalez | G09G 3/32 |
| 2019/0103047 A1* | 4/2019 | Chung | G09G 3/3607 |
| 2019/0189726 A1 | 6/2019 | Wu et al. | |
| 2019/0285931 A9* | 9/2019 | Gilbert | H04N 13/351 |
| 2019/0355330 A1* | 11/2019 | Lin | G09G 3/2003 |

* cited by examiner

| | R(sub1) | | G(sub1) | | B(sub1) | |
|---|---|---|---|---|---|---|
| main(1) | main(2) | | | | | |
| main(3) | main(4) | | | | | |
| main(5) | main(6) | | | | | |
| main(7) | main(8) | | | | | |
| main(9) | main(10) | | | | | |
| main(11) | main(12) | | | | | |

DISPLAYING DEVICE AND DRIVING METHOD THEREOF

CROSS REFERENCE TO RELEVANT APPLICATIONS

The present disclosure claims the priority of the Chinese patent application filed on Aug. 26, 2020 before the Chinese Patent Office with the application number of 202010873202.2 and the title of "DISPLAYING DEVICE AND DRIVING METHOD THEREOF", which is incorporated herein in its entirety by reference.

TECHNICAL FIELD

The present disclosure relates to the technical field of displaying, and particularly relates to a displaying device and a driving method thereof.

BACKGROUND

In recent years, in order to improve the contrast of Liquid Crystal Display (LCD) products, the technique of Mini/Micro LED has been paid great attention and developed well. Currently, the technique of Mini/Micro LED is mainly applied to the technique of backlight, in combination with the technique of local dimming, which can effectively increase the displaying contrast of LCDs, to greatly improve the effect of displaying of the products.

SUMMARY

The present disclosure provides a displaying device and a driving method thereof.

The present disclosure provides a displaying device, wherein the displaying device comprises:

a first display panel, comprising a plurality of first pixel units that are able to display a color, wherein each of the first pixel units comprises a plurality of sub-pixel units; and a second display panel, provided on a light exiting side of the first display panel, and comprising a plurality of second pixel units;

wherein a distribution density of the plurality of second pixel units is greater than a distribution density of the plurality of sub-pixel units.

Optionally, an orthographic projection of each of the sub-pixel units on the second display panel covers a preset quantity of second pixel units.

Optionally, the displaying device further comprises:

a driving circuit configured for acquiring first grayscale values of each of the sub-pixel units of the first display panel, determining second grayscale values of each of the second pixel units of the second display panel according to the first grayscale values, and according to the second grayscale values, driving the second display panel to display, to regulate a transmittance of an emergent light of the first display panel through the second display panel.

Optionally, the second display panel is a liquid-crystal display panel that does not have a color film.

Optionally, the first display panel is an OLED display panel.

Optionally, the first display panel comprises first grid lines, the second display panel comprises second grid lines, and orthographic projections of the sub-pixel units connected to the first grid lines on the second display panel overlap with the second pixel units connected to the second grid lines; and the drive circuit is further configured for, within a refresh cycle of one frame of image, outputting synchronous scanning signals to the second grid lines and the first grid lines.

Optionally, the first display panel is a liquid-crystal display panel provided with a color film.

Optionally, the displaying device further comprises: a backlight source that is provided on a side of the first display panel that is further away from the second display panel.

Optionally, the first display panel comprises third grid lines, the second display panel comprises fourth grid lines, and orthographic projections of the sub-pixel units connected to the third grid lines on the second display panel overlap with the second pixel units connected to the fourth grid lines; and the drive circuit is further configured for, within a refresh cycle of one frame of image, outputting a scanning signal to the third grid lines and a scanning signal to the fourth grid lines, wherein the scanning signal to the fourth grid lines is delayed as compared with the scanning signal to the third grid lines.

Optionally, a delay time of the scanning signal to the fourth grid lines as compared with the scanning signal to the third grid lines is a response time of the first display panel.

Optionally, a refresh frequency of the first display panel and a refresh frequency of the second display panel are equal.

The present disclosure further discloses a driving method for a displaying device, wherein the method is for driving the displaying device according to any one of the above embodiments, and the driving method comprises:

acquiring first grayscale values of each of the sub-pixel units of the first display panel; and determining second grayscale values of each of the second pixel units of the second display panel according to the first grayscale values, and according to the second grayscale values, driving the second display panel to display, to regulate a transmittance of an emergent light of the first display panel through the second display panel.

Optionally, the first display panel comprises a first sub-pixel unit, an orthographic projection of the first sub-pixel unit on the second display panel covers a preset quantity of second pixel units, and the step of determining second grayscale values of each of the second pixel units of the second display panel according to the first grayscale values comprises:

according to the first grayscale value of the first sub-pixel unit, the first grayscale values of neighboring sub-pixel units of the first sub-pixel unit, and the preset quantity, determining second grayscale values that correspond to the preset quantity of second pixel units.

Optionally, the step of, according to the first grayscale value of the first sub-pixel unit, the first grayscale values of the neighboring sub-pixel units of the first sub-pixel unit, and the preset quantity, determining the second grayscale values that correspond to the preset quantity of second pixel units comprises:

according to a difference between the first grayscale value of the first sub-pixel unit and the first grayscale values of neighboring sub-pixel units of the first sub-pixel unit, and the preset quantity, by interpolative processing, determining the second grayscale values that correspond to the preset quantity of second pixel units.

The present disclosure further provides a calculating and processing device, wherein the calculating and processing device comprises:

a memory storing a computer-readable code; and one or more processors, wherein when the computer-readable code is executed by the one or more processors, the calculating and processing device implements the driving method stated above.

The present disclosure further provides a computer program, wherein the computer program comprises a computer-readable code, and when the computer-readable code is executed on a calculating and processing device, the computer-readable code causes the calculating and processing device to implement the driving method stated above.

The present disclosure further provides a computer-readable medium, wherein the computer-readable medium stores the computer program stated above.

The above description is merely a summary of the technical solutions of the present disclosure. In order to more clearly know the elements of the present disclosure to enable the implementation according to the contents of the description, and in order to make the above and other purposes, features and advantages of the present disclosure more apparent and understandable, the particular embodiments of the present disclosure are provided below.

BRIEF DESCRIPTION OF THE DRAWINGS

In order to more clearly illustrate the technical solutions of the embodiments of the present disclosure, the figures that are required to describe the embodiments of the present disclosure will be briefly introduced below. Apparently, the figures that are described below are embodiments of the present disclosure, and a person skilled in the art can obtain other figures according to these figures without paying creative work.

DETAILED DESCRIPTION

In order to make the above purposes, features and advantages of the present disclosure more apparent and understandable, the present disclosure will be described in further detail below with reference to the drawings and the particular embodiments.

Figure 1:
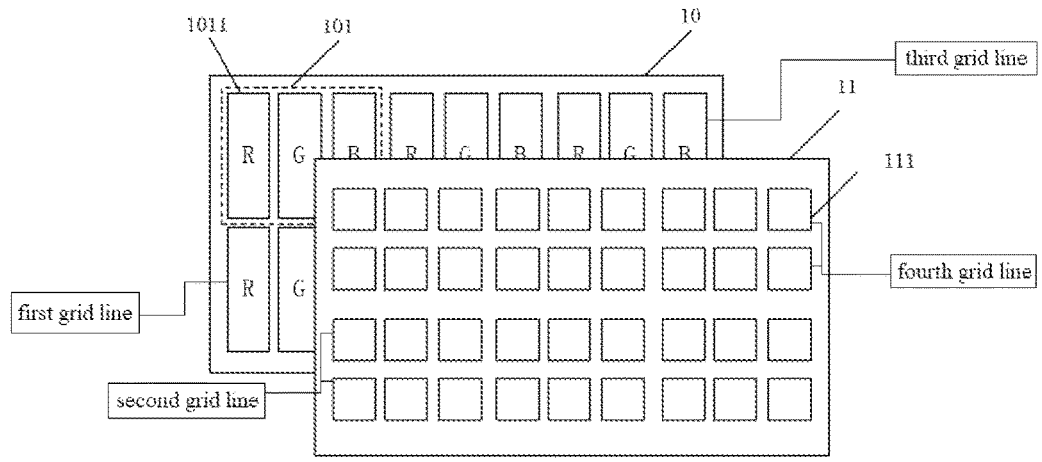
FIG. 1 shows a schematic structural diagram of the displaying device according to an embodiment of the present disclosure.

An embodiment of the present disclosure provides a displaying device. Referring to FIG. 1, the displaying device may comprise:

a first display panel 10, comprising a plurality of first pixel units 101 that are able to display a color, wherein each of the first pixel units 101 comprises a plurality of sub-pixel units 1011; and a second display panel 11, provided on the light exiting side of the first display panel 10, and comprising a plurality of second pixel units 111;

wherein the distribution density of the plurality of second pixel units 111 is greater than the distribution density of the plurality of sub-pixel units 1011.

The function of each of the second pixel units 111 of the second display panel 11 is to regulate the transmittance of the incident light (i.e., the emergent light of the first display panel 10). In order to reduce the power consumption of the displaying device and increase the luminous efficiency, the second display panel 11 may be a display panel that can merely perform black and white displaying; for example, the second display panel 11 may be a liquid-crystal display panel that does not have a color film.

In practical applications, when the sub-pixel units 1011 of the first display panel 10 are required to display a frame of low grayscales, the grayscale values of the second pixel units 111 corresponding to those sub-pixel units 1011 of low grayscales (for example, the second pixel units 111 that overlap with the orthographic projections of those sub-pixel units 1011 of low grayscales on the second display panel 11) may be controlled to be correspondingly low, to reduce the frame displaying brightness of that area of the displaying device. When the sub-pixel units 1011 of the first display panel 10 are required to display a frame of high grayscales, the grayscale values of the second pixel units 1*l* corresponding to those sub-pixel units 1011 of high grayscales (for example, the second pixel units 111 that overlap with the orthographic projections of those sub-pixel units 1011 of high grayscales on the second display panel 11) may be controlled to be correspondingly high, to increase the frame displaying brightness of that area of the displaying device. Therefore, the displaying device according to the present embodiment can increase the contrast of the displayed frame.

Assuming that the contrast of a displayed frame itself of the first display panel 10 is 500:1, and the contrast of the second display panel 11 is also 500:1, then, when the first display panel 10 and the second display panel 11 are stacked to display the frame, the maximum values of the contrasts are also superposed, and the superposed contrast is 250000:1. It can be seen that the displaying device according to the present embodiment can greatly increase the contrast of the displayed frame.

Figures 3, 4:
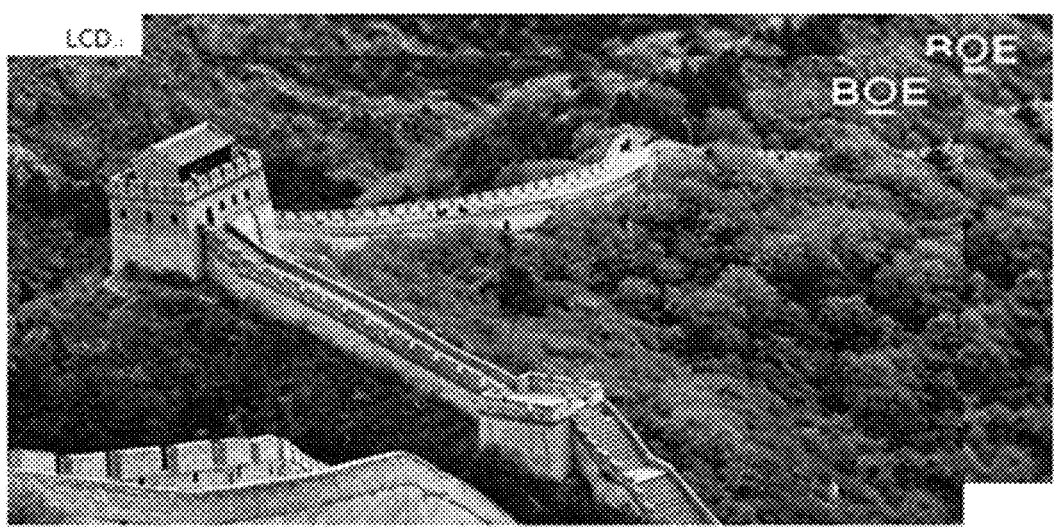
FIG. 3 shows a schematic structural diagram of the sub-pixel units of the first display panel and the second pixel units of the second display panel according to an embodiment of the present disclosure.
FIG. 4 shows a schematic diagram of the effect of image displaying of the first display panel and the second display panel according to an embodiment of the present disclosure.
Figure 5:
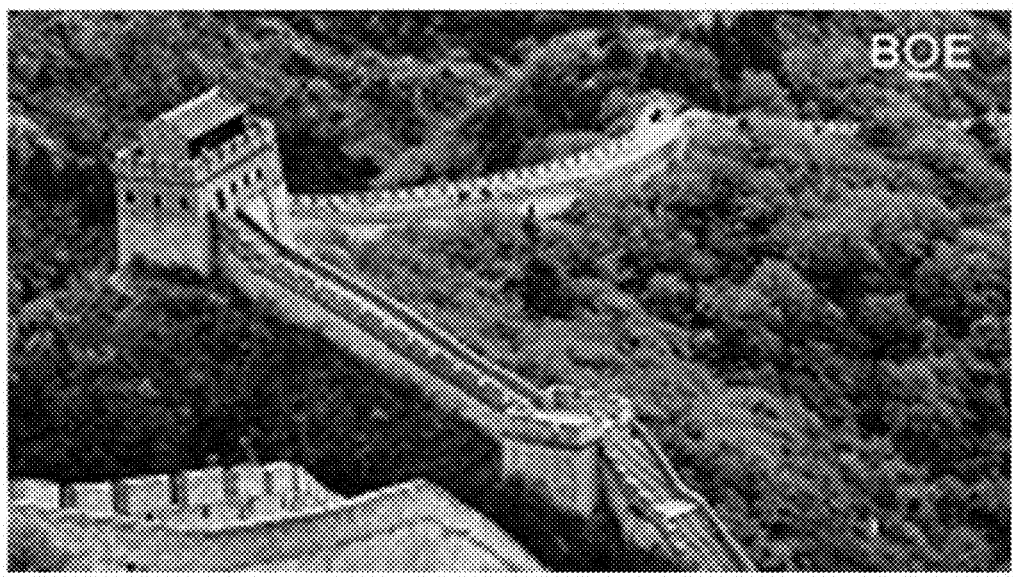
FIG. 5 shows a schematic diagram of the effect of image displaying of the first display panel according to an embodiment of the present disclosure.
Figure 6:
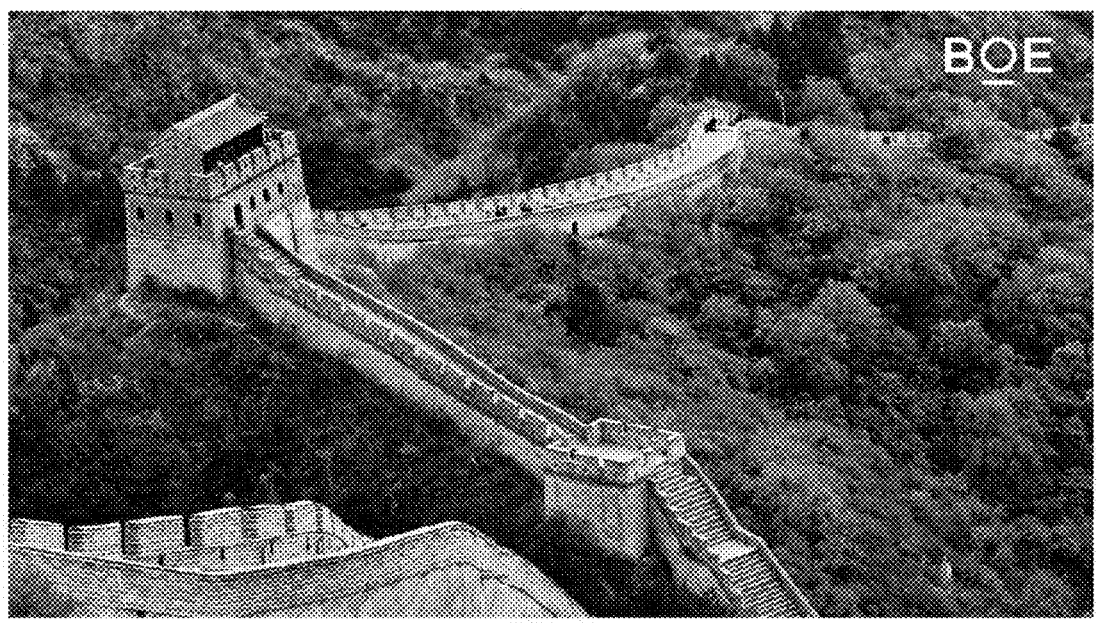
FIG. 6 shows a schematic diagram of the effect of image displaying of the second display panel according to an embodiment of the present disclosure.

The distribution density of the plurality of second pixel units 1ll is greater than the distribution density of the plurality of sub-pixel units 1011; in other words, the resolution of the second display panel 11 is higher than the resolution of the first display panel 10. As shown in FIG. 4, by providing the second display panel 11 of a higher resolution at the light exiting side of the first display panel 10, the displayed frame of the first display panel 10, after passing through the second display panel 11, can become finer, which realizes image displaying of a higher resolution, and further increases the pixel density (Pixels Per Inch, PPI). The resolution of the first display panel 10 is 240*135, and its effect of displaying is shown in FIG. 5. The resolution of the second display panel 11 is 3840*2160, and its effect of displaying is shown in FIG. 6.

With the increase of the resolution, the difficulty in the processing of color display panels is increasingly higher. However, the second display panel 11 may be a black-and-white display panel, and, as compared with color display panels, the difficulty in the processing of the lack-and-white display panel can be greatly reduced. Therefore, by providing the second display panel 11 of a higher resolution and of black and white displaying at the light exiting side of the first display panel, the present embodiment can effectively increase the degree of refinement of the frame displaying without increasing the difficulty in the processing, to increase the resolution of the displaying device.

The displaying device according to the present embodiment, by providing the second display panel on the light exiting side of the first display panel, in frame displaying of the first display panel, can perform grayscale dimming to the second display panel, thereby changing the contrast of the displayed frame of the first display panel, to increase the contrast of the displayed frame of the displaying device. In addition, by providing the second display panel of a higher resolution at the light exiting side of the first display panel, the present embodiment can effectively increase the degree of refinement of the frame displaying without increasing the difficulty in the processing, to increase the resolution of the displaying device.

Figure 2:
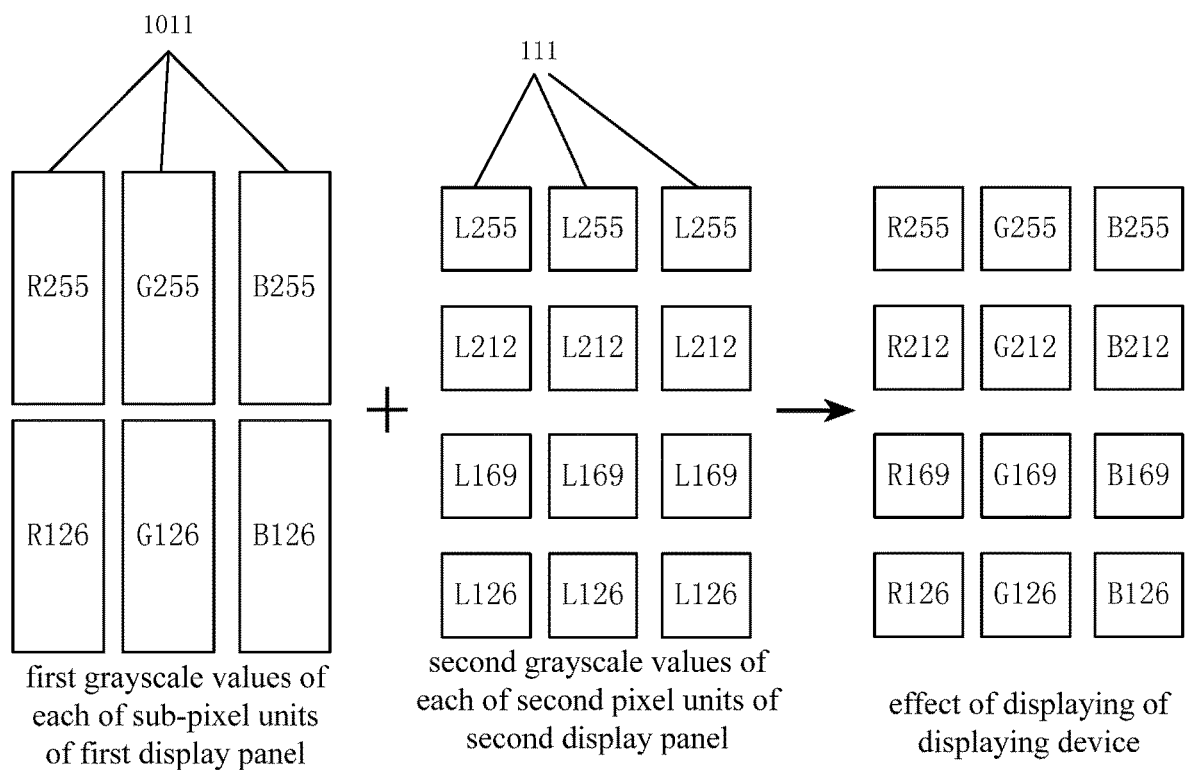
FIG. 2 shows a schematic diagram of the interpolative calculation of the grayscales of each of the second pixel units of the second display panel according to an embodiment of the present disclosure.

Optionally, the orthographic projection of each of the sub-pixel units 1011 of the first display panel 10 on the second display panel 11 may cover a preset quantity of second pixel units 111. As shown in FIG. 2, the orthographic projection of each of the sub-pixel units 1011 on the second display panel 11 can cover 2 second pixel units 111. As shown in FIG. 3, the orthographic projection of each of the sub-pixel units 1011 on the second display panel 11 can cover 12 second pixel units 111.

Optionally, the displaying device according to the present embodiment may further comprise a driving circuit configured for acquiring first grayscale values of each of the sub-pixel units 1011 of the first display panel 10, determining second grayscale values of each of the second pixel units 111 of the second display panel 11 according to the first grayscale values, and according to the second grayscale values, driving the second display panel 11 to display, to regulate the transmittance of the emergent light of the first display panel 10 through the second display panel 11.

In frame displaying of the first display panel, the driving circuit can, according to the first grayscale values of each of the sub-pixel units of the first display panel, control each of the second pixel units of the second display panel to display second grayscale values, thereby realizing the grayscale dimming of the second display panel, and increase the contrast of the displayed frame of the displaying device.

In a particular implementation, there are diversified modes to realize determining the second grayscale values of each of the second pixel units 111 of the second display panel 11 according to the first grayscale values of each of the sub-pixel units 1011 of the first display panel 10. Optionally, assuming that the first display panel 10 comprises a first sub-pixel unit (which may be any one of the sub-pixel units 1011), and the orthographic projection of the first sub-pixel unit on the second display panel 11 covers a preset quantity of second pixel units 111, then, in such a case, the second grayscale values of the preset quantity of second pixel units Ill may be determined according to the first grayscale value of the first sub-pixel unit, the first grayscale values of neighboring sub-pixel units of the first sub-pixel unit, and the preset quantity.

In a case in which one sub-pixel unit 1011 corresponds to a plurality of second pixel units 111, the second grayscale values of each of the second pixel units 111 of the second display panel 11 may be determined according to the first grayscale values of each of the sub-pixel units 1011 by interpolation. In practical applications, the determination of the second grayscale values of each of the second pixel units 111 of the second display panel 11 is not limited to the above calculation modes, and is not limited in the embodiments of the present disclosure.

As shown in FIG. 2, each of the sub-pixel units 1011 corresponds to two second pixel units 111. Taking the column R as an example, the first grayscale values of the two sub-pixel units 1011 in the column R are R255 and R126, and the column R corresponds to four second pixel units 111. In this case, it can be determined, according to the difference between 255 and 126 and by interpolative processing, that the second grayscale values of the four second pixel units 111 in the column R are L255, L212, L169 and L126. In such a manner, the second grayscale values of all of the second pixel units Ill of the second display panel 11 can be calculated out.

The first display panel 10 may be an Organic Light-Emitting Diode (OLED) display panel, and may also be a liquid-crystal display panel provided with a color film.

In an alternative implementation, the first display panel 10 is an OLED display panel, the second display panel 11 is a liquid-crystal display panel that does not have a color film, the first display panel 10 comprises first grid lines, the second display panel 11 comprises second grid lines, the orthographic projections of the sub-pixel units 1011 connected to the first grid lines on the second display panel 11 overlap with the second pixel units 111 connected to the second grid lines, and the drive circuit is further configured for, within a refresh cycle of one frame of image, outputting synchronous scanning signals to the second grid lines and the first grid lines; in other words, the scanning signal to the second grid lines and the scanning signal to the first grid lines are synchronous.

In another alternative implementation, the first display panel 10 is a liquid-crystal display panel provided with a color film, the second display panel 11 is a liquid-crystal display panel that does not have a color film, the first display panel 10 comprises third grid lines, the second display panel 11 comprises fourth grid lines, the orthographic projections of the sub-pixel units 1011 connected to the third grid lines on the second display panel 11 overlap with the second pixel units 111 connected to the fourth grid lines, and the drive circuit is further configured for, within a refresh cycle of one frame of image, outputting a scanning signal to the third grid lines and a scanning signal to the fourth grid lines, wherein the scanning signal to the fourth grid lines is delayed as compared with the scanning signal to the third grid lines; in other words, the scanning signal to the fourth grid lines is delayed as compared with the scanning signal to the third grid lines.

The delay time of the scanning signal to the fourth grid lines as compared with the scanning signal to the third grid lines is the response time of the first display panel 10, which can prevent trailing of the frame.

When both of the first display panel 10 and the second display panel 11 are a liquid-crystal display panel, the displaying device may further comprise: a backlight source that is provided on the side of the first display panel 10 that is further away from the second display panel 11.

In such a case, by multiplying the transmittance t(sub) of the first display panel 10 and the transmittance t(main) of the second display panel 11, the transmittance t(ori) of the displaying device can be obtained, i.e., t(ori)=t(sub)*t(main). Accordingly, according to the first grayscale values sub of each of the sub-pixel units 1011 of the first display panel 10, the second grayscale values main of each of the second pixel units 111 of the second display panel 11, the relation between the transmittances and the relations between the grayscales and the transmittances (as shown in the following), the grayscale values ori of each of the pixels of the displaying device can be obtained by calculation.

$$t(ori) = \left(\frac{ori}{255}\right)^{2.2}$$

$$t(sub) = \left(\frac{sub}{255}\right)^{\gamma 1}$$

$$t(main) = \left(\frac{main}{255}\right)^{\gamma 2}$$

In that, γ1 is the gamma value of the first display panel 10, and γ2 is the gamma value of the second display panel 11.

Regarding the structure shown in FIG. 3, in which the orthographic projection of each of the sub-pixel units 1011 on the second display panel 11 covers 12 second pixel units 111, or, in other words, each of the sub-pixel units 1011 corresponds to 12 second pixel units 111 of the second display panel 11, in such a case, the transmittances of the displaying device may satisfy the following relations:

$$R(ori_{block}) = R(sub1) * \frac{t(main(1)) + t(main(2)) + \ldots + t(main(12))}{12}$$

$$G(ori_{block}) = G(sub1) * \frac{t(main(13)) + t(main(14)) + \ldots + t(main(24))}{12}$$

$$B(ori_{block}) = B(sub1) * \frac{t(main(25)) + t(main(26)) + \ldots + t(main(36))}{12}$$

wherein R($ori_{block}$)/G($ori_{block}$)/B($ori_{block}$) represent the transmittances of the areas corresponding to the positions of one red/green/blue sub-pixel unit 1011 in the displaying device, R(sub1)/G(sub1)/B(sub1) represent the transmittances of one red/green/blue sub-pixel unit 1011, and t(main(n)) (n=1, 2 . . . 36) represent the transmittances of one second pixel unit 111.

In order to ensure the effect of displaying, the refresh frequencies of the first display panel 10 and the second display panel 11 may be equal, wherein the refresh frequency may be 60 Hz, 120 Hz. 180 Hz and so on.

The technical solutions of the present disclosure provide solutions of structures for increasing the contrast and the resolution of the displaying device. By providing the second display panel, which can regulate the transmittance of itself, at the light exiting side of the first display panel, in frame displaying of the first display panel, can, according to the first grayscale values of each of the sub-pixel units of the first display panel, control each of the second pixel units of the second display panel to display second grayscale values, and, by performing grayscale dimming to the second display panel, change the contrast of the displayed frame of the first display panel, thereby increasing the contrast of the displayed frame of the displaying device. In addition, the second display panel provided on the light exiting side of the first display panel can have a high resolution, which effectively increases the actual resolution of the image displaying of the product, to enable the displayed frame to be finer.

Figure 7:
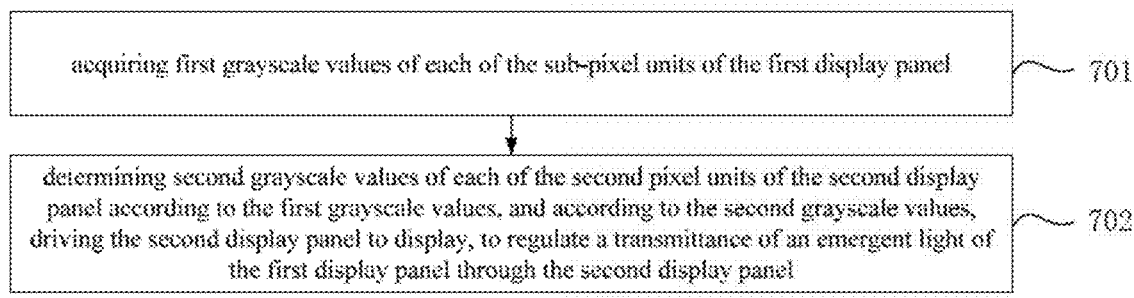
FIG. 7 shows a flow chart of the driving method for a displaying device according to an embodiment of the present disclosure.

Another embodiment of the present disclosure further provides a driving method for a displaying device, wherein the method is for driving the displaying device according to any one of the above embodiments. Referring to FIG. 7, the driving method may comprise:

Step 701: acquiring first grayscale values of each of the sub-pixel units of the first display panel.

Step 702: determining second grayscale values of each of the second pixel units of the second display panel according to the first grayscale values, and according to the second grayscale values, driving the second display panel to display, to regulate a transmittance of an emergent light of the first display panel through the second display panel.

The subject of the implementation of the present embodiment may be the driving circuit stated above.

Optionally, the first display panel comprises a first sub-pixel unit, an orthographic projection of the first sub-pixel unit on the second display panel covers a preset quantity of second pixel units, and the step 702 may particularly comprise:

according to the first grayscale value of the first sub-pixel unit, the first grayscale values of neighboring sub-pixel units of the first sub-pixel unit, and the preset quantity, determining second grayscale values that correspond to the preset quantity of second pixel units.

The particular implementation of each of the steps of the present embodiment may refer to the description on the embodiments of the displaying device, which is not discussed herein further.

An embodiment of the present disclosure provides a displaying device and a driving method thereof, wherein the displaying device comprises a first display panel, a second display panel and a driving circuit; the first display panel comprises a plurality of first pixel units that are able to display a color, wherein each of the first pixel units comprises a plurality of sub-pixel units; and the second display panel is provided on a light exiting side of the first display panel, comprising a plurality of second pixel units; wherein a distribution density of the plurality of second pixel units is greater than a distribution density of the plurality of sub-pixel units. Accordingly, by providing the second display panel on the light exiting side of the first display panel, in frame displaying of the first display panel, can perform grayscale dimming to the second display panel, thereby changing the contrast of the displayed frame of the first display panel, to increase the contrast of the displayed frame of the displaying device. In addition, by providing the second display panel of a higher resolution at the light exiting side of the first display panel, the present embodiment can effectively increase the degree of refinement of the flame displaying without increasing the difficulty in the processing, to increase the resolution of the displaying device.

The above-described device embodiments are merely illustrative, wherein the units that are described as separate components may or may not be physically separate, and the components that are displayed as units may or may not be physical units; in other words, they may be located at the same one location, and may also be distributed to a plurality of network units. Part or all of the modules may be selected according to the actual demands to realize the purposes of the solutions of the embodiments. A person skilled in the art can understand and implement the technical solutions without paying creative work.

Each component embodiment of the present disclosure may be implemented by hardware, or by software modules that are operated on one or more processors, or by a combination thereof. A person skilled in the art should understand that some or all of the functions of some or all of the components of the calculating and processing device according to the embodiments of the present disclosure may be implemented by using a microprocessor or a digital signal processor (DSP) in practice. The present disclosure may also be implemented as apparatus or device programs (for example, computer programs and computer program products) for implementing part of or the whole of the method described herein. Such programs for implementing the present disclosure may be stored in a computer-readable medium, or may be in the form of one or more signals. Such signals may be downloaded from an Internet website, or provided on a carrier signal, or provided in any other forms.

Figure 8:
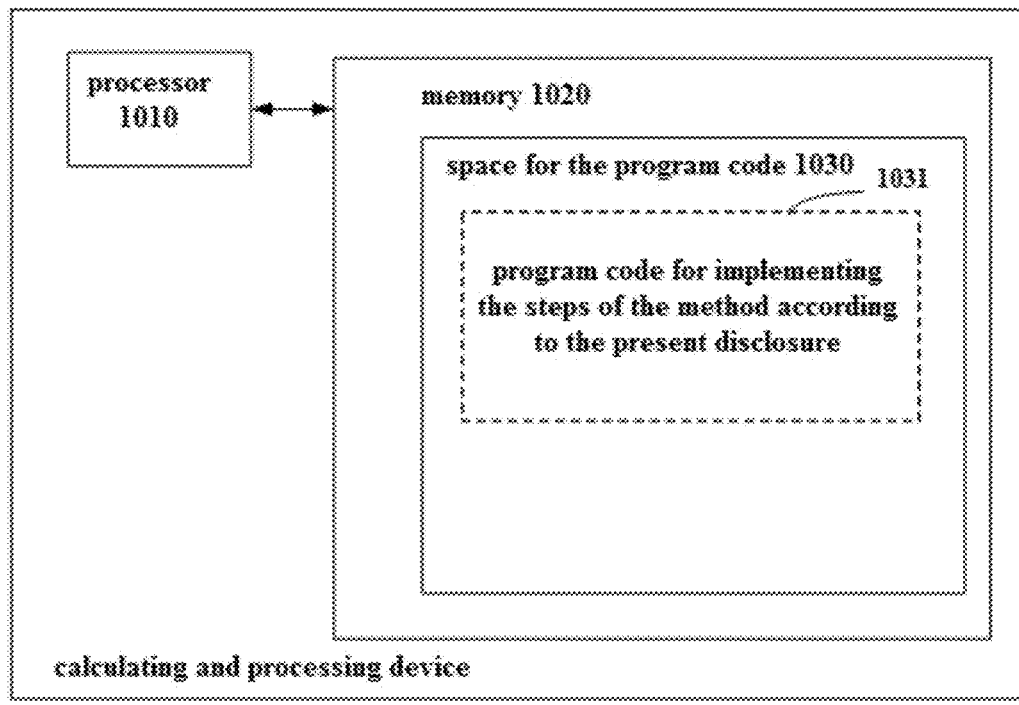
FIG. 8 schematically shows a block diagram of a calculating and processing device for implementing the method according to the present disclosure.
Figure 9:
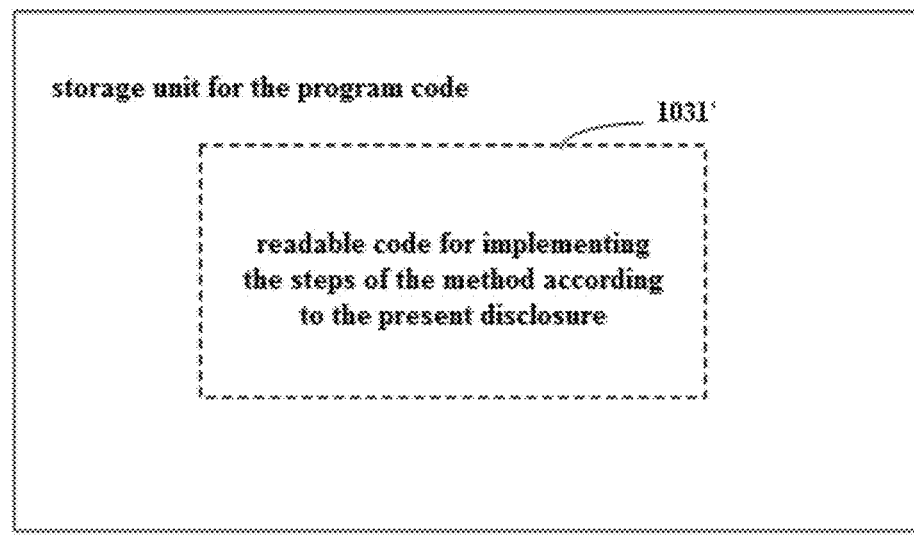
FIG. 9 schematically shows a storage unit for maintaining or carrying a program code for implementing the method according to the present disclosure.

For example, FIG. 8 shows a calculating and processing device that can implement the method according to the present disclosure. The calculating and processing device traditionally comprises a processor 1010 and a computer program product or computer-readable medium in the form of a memory 1020. The memory 1020 may be electronic memories such as flash memory, EEPROM (Electrically Erasable Programmable Read Only Memory), EPROM, hard disk or ROM. The memory 1020 has the storage space 1030 of the program code 1031 for implementing any steps of the above method. For example, the storage space 1031 for program code may contain program codes 1031 for individually implementing each of the steps of the above method. Those program codes may be read from one or more computer program products or be written into the one or more computer program products. Those computer program products include program code carriers such as hard disk, compact disk (CD), memory card or floppy disk as shown in FIG. 9. Such computer program products are usually portable or fixed storage units. The storage unit may have storage segments or storage spaces with similar arrangement to the memory 1020 of the calculating and processing device in FIG. 8. The program codes may for example be compressed in a suitable form. Generally, the storage unit contains a computer-readable code 1031' which can be read by a processor like 1010. When those codes are executed by the calculating and processing device, the codes cause the calculating and processing device to implement each of the steps of the method described above.

The description provided herein describes many concrete details. However, it can be understood that the embodiments of the present disclosure may be implemented without those concrete details. In some of the embodiments, well-known processes, structures and techniques are not described in detail, so as not to affect the understanding of the description.

The embodiments of the description are described in the mode of progression, each of the embodiments emphatically describes the differences from the other embodiments, and the same or similar parts of the embodiments may refer to each other.

Finally, it should also be noted that, in the present text, relation terms such as first and second are merely intended to distinguish one entity or operation from another entity or operation, and that does not necessarily require or imply that those entities or operations have therebetween any such actual relation or order. Furthermore, the terms "include", "comprise" or any variants thereof are intended to cover non-exclusive inclusions, so that processes, methods, articles or devices that include a series of elements do not only include those elements, but also include other elements that are not explicitly listed, or include the elements that are inherent to such processes, methods, articles or devices. Unless further limitation is set forth, an element defined by the wording "comprising a . . . " does not exclude additional same element in the process, method, article or device comprising the element.

The displaying device and the driving method thereof according to the present disclosure have been described in detail above. The principle and the embodiments of the present disclosure are described herein with reference to the particular examples, and the description of the above embodiments is merely intended to facilitate to understand the method according to the present disclosure and its core concept. Moreover, for a person skilled in the art, according to the concept of the present disclosure, the particular embodiments and the range of application may be varied. In conclusion, the contents of the description should not be understood as limiting the present disclosure.

The invention claimed is:

1. A displaying device, wherein the displaying device comprises:
    a first display panel, comprising a plurality of first pixel units that are able to display a color, wherein each of the first pixel units comprises a plurality of sub-pixel units; and
    a second display panel, provided on a light exiting side of the first display panel, and comprising a plurality of second pixel units;
    wherein a distribution density of the plurality of second pixel units is greater than a distribution density of the plurality of sub-pixel units;
    a driving circuit configured for acquiring first grayscale values of each of the sub-pixel units of the first display panel, determining second grayscale values of each of the second pixel units of the second display panel according to the first grayscale values, and according to the second grayscale values, driving the second display panel to display, to regulate a transmittance of an emergent light of the first display panel through the second display panel;
    wherein, the second grayscale values of each of the second pixel units of the second display panel are determined according to the first grayscale values of each of the sub-pixel units by interpolation;
    the second display panel is a liquid-crystal display panel without a color film;
    the first display panel is a liquid-crystal display panel provided with a color film;
    the first display panel comprises third grid lines, the second display panel comprises fourth grid lines, and orthographic projections of the sub-pixel units connected to the third grid lines on the second display panel overlap with the second pixel units connected to the fourth grid lines; and
    the driving circuit is further configured for, within a refresh cycle of one frame of image, outputting a scanning signal to the third grid lines and a scanning signal to the fourth grid lines, wherein the scanning signal to the fourth grid lines is delayed as compared with the scanning signal to the third grid lines; and
    a delay time of the scanning signal to the fourth grid lines as compared with the scanning signal to the third grid lines is a response time of the first display panel.

2. The displaying device according to claim 1, wherein an orthographic projection of each of the sub-pixel units on the second display panel covers a preset quantity of second pixel units.

3. The displaying device according to claim 1, wherein the first display panel is an OLED display panel.

4. The displaying device according to claim 3, wherein the first display panel comprises first grid lines, the second display panel comprises second grid lines, and orthographic projections of the sub-pixel units connected to the first grid lines on the second display panel overlap with the second pixel units connected to the second grid lines; and the driving circuit is further configured for, within a refresh cycle of one frame of image, outputting synchronous scanning signals to the second grid lines and the first grid lines.

5. The displaying device according to claim 1, wherein the displaying device further comprises: a backlight source that is provided on a side of the first display panel that is further away from the second display panel.

6. The displaying device according to claim 1, wherein a refresh frequency of the first display panel and a refresh frequency of the second display panel are equal.

7. A driving method, wherein the method is for driving the displaying device according to claim 1, and the driving method comprises:

acquiring the first grayscale values of each of the sub-pixel units of the first display panel; and determining the second grayscale values of each of the second pixel units of the second display panel according to the first grayscale values, and according to the second grayscale values, driving the second display panel to display, to regulate the transmittance of the emergent light of the first display panel through the second display panel.

8. The driving method according to claim 7, wherein the first display panel comprises a first sub-pixel unit, an orthographic projection of the first sub-pixel unit on the second display panel covers a preset quantity of second pixel units, and the step of determining second grayscale values of each of the second pixel units of the second display panel according to the first grayscale values comprises:

according to the first grayscale value of the first sub-pixel unit, the first grayscale values of neighboring sub-pixel units of the first sub-pixel unit, and the preset quantity, determining second grayscale values that correspond to the preset quantity of second pixel units.

9. The driving method according to claim 8, wherein the step of, according to the first grayscale value of the first sub-pixel unit, the first grayscale values of the neighboring sub-pixel units of the first sub-pixel unit, and the preset quantity, determining the second grayscale values that correspond to the preset quantity of second pixel units comprises:

according to a difference between the first grayscale value of the first sub-pixel unit and the first grayscale values of neighboring sub-pixel units of the first sub-pixel unit, and the preset quantity, by interpolative processing, determining the second grayscale values that correspond to the preset quantity of second pixel units.

10. A calculating and processing device, wherein the calculating and processing device comprises:

a memory storing a computer-readable code; and one or more processors, wherein when the computer-readable code is executed by the one or more processors, the calculating and processing device implements the driving method according to claim 7.

11. A computer program product, wherein the computer program product comprises a non-transitory computer readable storage medium storing computer-readable code, and when the computer-readable code is executed on a calculating and processing device, the computer-readable code causes the calculating and processing device to implement the driving method according to claim 7.

12. A non-transitory computer-readable medium, wherein the non-transitory computer-readable medium stores the computer program according to claim 11.

* * * * *